United States Patent [19]

Dönges et al.

[11] Patent Number: 4,530,747
[45] Date of Patent: Jul. 23, 1985

[54] PHOTOPOLYMERIZABLE MIXTURE AND PHOTOPOLYMERIZABLE COPYING MATERIAL PREPARED THEREWITH

[75] Inventors: Reinhard Dönges, Bad Soden; Klaus Horn, Hofheim, both of Fed. Rep. of Germany

[73] Assignee: Hoechst Aktiengesellschaft, Frankfurt am Main, Fed. Rep. of Germany

[21] Appl. No.: 504,180

[22] Filed: Jun. 14, 1983

[30] Foreign Application Priority Data

Jun. 21, 1982 [DE] Fed. Rep. of Germany ....... 3223105
Jul. 27, 1982 [DE] Fed. Rep. of Germany ....... 3227913

[51] Int. Cl.³ .................. C08J 3/28; C08L 33/02; C08L 33/04; C08L 69/00
[52] U.S. Cl. .................. 204/159.16; 204/159.15; 204/159.23; 525/57; 525/277
[58] Field of Search .................. 204/159.15, 159.16, 204/159.17, 159.23; 525/57, 277, 302, 301

[56] References Cited

U.S. PATENT DOCUMENTS

| | | | |
|---|---|---|---|
| 2,760,863 | 8/1956 | Plambeck, Jr. | 430/306 |
| 3,661,576 | 5/1972 | Crary | 96/35.1 |
| 4,230,790 | 10/1980 | Hill | 430/288 |
| 4,246,336 | 1/1981 | Berlin et al. | 430/288 |
| 4,264,708 | 4/1981 | Chambers et al. | 430/278 |
| 4,275,142 | 6/1981 | Hosaka et al. | 430/271 |
| 4,308,338 | 12/1981 | Chambers et al. | 430/300 |
| 4,367,280 | 1/1983 | Kondo et al. | 204/159.16 |
| 4,372,836 | 2/1983 | Schmitt et al. | 204/159.23 |
| 4,379,038 | 4/1983 | Kaetsu et al. | 204/159.16 |
| 4,383,903 | 5/1983 | Ayano et al. | 204/159.15 |
| 4,427,823 | 1/1984 | Inagaki et al. | 204/159.16 |

FOREIGN PATENT DOCUMENTS

| | | |
|---|---|---|
| 1282061 | 7/1972 | United Kingdom . |
| 1521372 | 8/1978 | United Kingdom . |
| 1532196 | 11/1978 | United Kingdom . |
| 1566125 | 4/1980 | United Kingdom . |

Primary Examiner—Allan M. Lieberman

Attorney, Agent, or Firm—Schwartz, Jeffery, Schwaab, Mack, Blumenthal & Evans

[57] ABSTRACT

Disclosed are a photopolymerizable mixture and photopolymerizable copy materials made therefrom. The mixture contains a polymerizable compound having terminal acrylic or methacrylic acid ester groups, selected from a compound of one of the general formulas

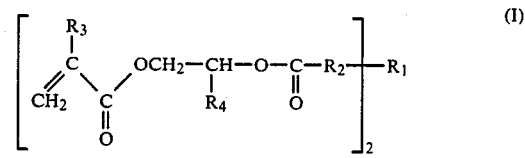

and

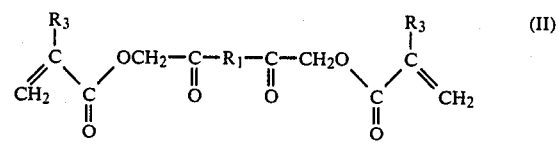

wherein $R_1$ is a phenylene group or a biphenyldiyl group or a group formed by two phenylene groups which are linked by a bridge comprising an oxygen atom, a sulphur atom, a sulfone group, a substituted or unsubstituted alkylene group or cycloalkylene group, or a group of the formula —(O-alkylene)$_n$O— with n=1–3, $R_2$ is an oxygen atom or the group $CH_2$—$CH_2$—CO;

$R_3$ is a hydrogen atom or a methyl radical; and $R_4$ is a hydrogen atom or the radical

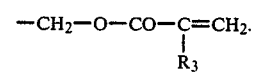

7 Claims, No Drawings

PHOTOPOLYMERIZABLE MIXTURE AND PHOTOPOLYMERIZABLE COPYING MATERIAL PREPARED THEREWITH

BACKGROUND OF THE INVENTION

The present invention relates to a photopolymerizable mixture which contains, as the essential constituents, (a) a compound, which is polymerizable by a free-radical mechanism and has terminal ethylenically unsaturated groups; (b) a polymeric binder; and (c) a polymerization initiator which can be activated by radiation.

Photopolymerizable mixtures of this type have been disclosed, for example, in U.S. Pat. No. 2,760,836, No. 3,060,023 and No. 3,149,975. The polymerizable, ethylenically unsaturated compounds described in these publications are low-molecular weight and high-molecular weight compounds having terminal or lateral vinyl groups or vinylidene groups, in particular acrylates and methacrylates of low-molecular weight of high-molecular weight polyhydroxy compounds. In practice, photopolymerizable materials based on esters of this type as the polymerizable compounds have gained acceptance almost exclusively. Among these, the low-molecular weight representatives in particular are preferentially used for industrial purposes.

During the processing of photopolymerizable mixtures of the type mentioned above it is necessary to eliminate, or at least to suppress as far as possible, the influence of the oxygen present in the ambient air on the radical polymerization, which in most cases is achieved by covering the photopolymerizable layer with a removable cover sheet which is impermeable to oxygen (U.S. Pat. No. 3,060,026) or with a cover layer which is impermeable to oxygen and is soluble in the developer used (U.S. Pat. No. 3,458,311). By this measure it is prevented that, during the light-induced polymerization, oxygen diffuses into the layer and causes chain termination reactions which result in an incomplete polymerization and thus in a reduced light sensitivity of the layer.

It is a disadvantage of these known materials that an additional working step is required for the application of the cover film or cover layer. In addition, the image resolution is reduced when self-supporting cover films, which in general have a thickness of about 20 μm, are employed in contact copying processes. Cover layers which are soluble in developer lead to an increased developer consumption and to an additional pollution of the waste water. Therefore, attempts have been made to develop photopolymerizable materials which, even without a special cover layer, exhibit a sufficient light sensitivity in the imagewise polymerization.

DE-A No. 28 30 143 discloses a material of this type which contains specific, polymerizable compounds having a higher molecular weight, and specific initiator systems, and for this reason has a low sensitivity to oxygen. The polymerizable compounds employed are acrylates or methacrylates which have been obtained by reacting acrylic or methacrylic acid with bis-epoxy compounds.

Similar materials, which are preferentially employed for the production of photoresist images, are described in DE-A No. 26 02 410.

In addition to a number of advantages, these known materials have the disadvantage that only certain desired properties can be achieved by using them. For example, it is desired that photopolymerizable layers employed without an oxygen-inhibiting cover layer be non-tacky, but flexible and show no tendency to crystallize. In general, it is, however, impossible to achieve such a combination of properties without having to add further monomers which, in turn, have a negative effect on other advantageous properties.

SUMMARY OF THE INVENTION

It is, therefore, an object of the present invention to provide improved radiation-polymerizable mixtures.

It is a further object of the invention to provide radiation-polymerizable mixtures which are distinguished by a high radiation sensitivity and which do not crystallize but nevertheless produce non-tacky surfaces, in particular when no oxygen-inhibiting cover layer is applied.

Another object of the invention is to provide an improved photopolymerizable copy material produced from the photopolymerizable mixtures according to the invention.

In accomplishing the foregoing objects, there has been provided according to one aspect of the present invention a mixture which is polymerizable by radiation, comprising:

(a) a polymerizable compound having terminal acrylic or methacrylic acid ester groups, selected from a compound of one of the general formulas

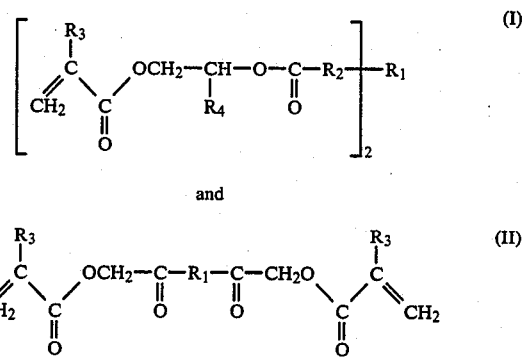

wherein $R_1$ is a phenylene group or a biphenyldiyl group or a group formed by two phenylene groups which are linked by a bridge comprising an oxygen atom, a sulphur atom, a sulfone group, a substituted or unsubstituted alkylene group or cycloalkylene group, or a group of the formula —(O-alkylene)$_n$O— with n=1–3, $R_2$ is an oxygen atom or the group $CH_2$—$CH_2$—CO;

$R_3$ is a hydrogen atom or a methyl radical; and $R_4$ is a hydrogen atom or the radical

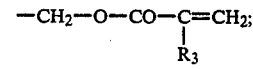

(b) a polymeric binder; and (c) a polymerization initiator which can be activated by radiation.

In accordance with another aspect of the invention, there has been provided a photopolymerizable copy material comprising a support layer and a layer of a photopolymerizable mixture as defined above placed on said support layer. The photopolymerizable mixture layer may be in open exposure to the atmosphere, i.e., no oxygen impermeable cover layer is needed.

Further objects, features and advantages of the invention will become apparent from the detailed description of preferred embodiments which follows.

DETAILED DESCRIPTION OF PREFERRED EMBODIMENTS

The invention is based on a radiation-polymerizable mixture which contains, as the essential components (a) a compound which can be polymerized by a free-radical mechanism and contains terminal acrylate or methacrylate groups;

(b) a polymeric binder; and (c) a polymerization initiator which can be activated by radiation.

The mixture of the invention is characterized in that it contains, as the polymerizable compound (a), a compound according to one of the general formulas

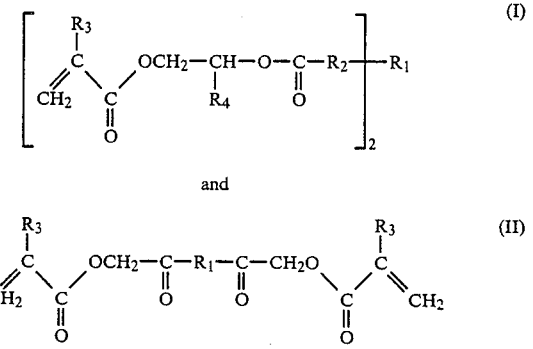

and $R_1$ is a phenylene group or a biphenyldiyl group or a group formed by two phenylene groups which are linked by a bridge which comprises an oxygen atom, a sulphur atom, a sulfone group, an optionally substituted alkylene group or cycloalkylene group or a group of the formula $-(O-\text{alkylene})_n O-$ with $n = 1-3$ $R_2$ is an oxygen atom or the group $CH_2-CH_2-CO$;

$R_3$ is a hydrogen atom or a methyl radical; and $R_4$ is a hydrogen atom or the radical

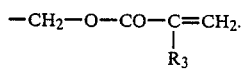

Examples of the $R_1$ groups are phen-1,4-ylene; phen-1,3-ylene; biphenyl-4,4'-diyl; tol-2,4-ylene; 1,3-xyl-4,6-ylene and 1,1,1-triphenyl-ethane-4,4'-ylene. Groups in which two phenyl groups are linked by an oxygen or sulphur atom or by a substituted alkylene group, and in particular by an oxygen atom or an alkylene group substituted by a carboxylic acid ester group, are preferably used.

The polymerizable compounds contained in the mixture of this invention are prepared by known methods. For example, polyvalent phenols of the formula $HO-R_1-OH$ can be converted into the corresponding bis-chlorocarboxylic acid acryl esters by reacting them with phosgene (as described, for example, by H. Schnell and L. Bottenbruch in "Makromolekulare Chemie" (Macromolecular Chemistry), 57, 1 (1962). By further reacting the product obtained with beta-hydroxyethyl-methacrylate or 1,3-bis-(methacryloyl)-glycerol, compounds of the general formula I with $R_2$=oxygen ore obtained.

By acylating aromatic compounds with chloroacetyl chloride under the conditions of the Friedel-Crafts reaction (for example, according to A. Dechamp, J. P. Tortei and E. Maréchal, Bull. Soc. chim. France, 1972, 3234), chloroacetyl aromatic compounds are formed, which can be reacted with acrylic or methacrylic acid to give polymerizable compounds of the general formula II.

If the acylating component used for the Friedel-Crafts reaction is succinic acid anhydride, omega-carboxylpropriophenone derivatives are obtained, which upon esterification with hydroxyalkylacrylate or hydroxyalkylmethacrylate yield polymerizable compounds of the general formula I, wherein $R_2$ is $CH_2CH_2CO$.

The photopolymerizable mixtures according to the present invention further contain polymeric binders. A great number of soluble organic polymers can be employed for this purpose.

Examples are: Polyamides, polyvinyl esters, polyvinyl acetals, polyvinyl ethers, polyacrylic acid esters, polymethacrylic acid esters, polyesters, alkyd resins, polyacrylamide, polyvinyl alcohol, polyethylene oxide, polydimethyl acrylamide, polyvinylmethyl formamide, polyvinylmethyl acetamide and copolymers of the monomers which form the homopolymers enumerated.

Other possible binders are natural substances or modified natural substances, for example, gelatin or cellulose ethers.

With particular advantage, those binders are used which are soluble or at least swellable in aqueous-alkaline solutions, since layers containing such binders can be developed with the preferably employed queous-alkaline developers. Binders of this type can, for example, contain the following groups: $-COOH$, $-PO_3H_2$, $-SO_3H$, $-SO_2NH_2$, or $-SO_2-NH-CO-$. Examples of these are: maleate resins, polymers of beta-methacryloyloxy-ethyl N-(p-tolyl-sulfonyl)carbamate and copolymers of these and similar monomers with other monomers, methyl methacrylate/methacrylic acid copolymers, or copolymers of methacrylic acid, alkyl methacrylates and methyl methacrylate and/or styrene, acrylonitrile and the like. The preferred binders are, however, copolymers of styrene and maleic acid anhydrides or of styrene and maleic acid esters.

A large number of substances can be used as photoinitiators in the mixture according to the invention. Examples are benzoin, benzoin ethers, polynuclear quinones, for example, 2-ethyl-anthraquinone, acridine derivatives, for example, 9-phenyl-acridine, 9-p-methoxyphenyl-acridine, 9-acetylamino-acridine and benz(a)acridine; phenazine derivates, for example, 9,10-dimethyl-benz(a)phenazine, 9-methyl-benz(a)phenazine and 10-methoxy-benz(a)phenazine; quinoxaline derivatives, for example, 6,4',4''-trimethoxy-2,3-diphenyl-quinoxaline and 4',4''-dimethoxy-2,3-diphenyl-5-aza-quinoxaline or quinazoline derivatives.

In addition to monomers, binders and photoinitiators the mixtures according to this invention may contain various other conventionally used additives, such as inhibitors to prevent thermal polymerization of the monomers, hydrogen donors, sensitometric modifiers, dyestuffs, and/or colored and uncolored pigments.

These constituents advantageously should be selected such that their absorption is as low as possible in the range of actinic radiation, which is important for the initiation process.

Within the scope of this invention, actinic radiation is to be understood as any radiation, the energy of which corresponds at least to that of shortwave visible light. Longwave UV-radiation, but also electron radiation, X-rays and laser radiation are particularly suitable.

The photopolymerizable layers produced using the mixtures according to this invention possess a high sensitivity to light, even if no oxygen-inhibiting cover layer is applied. The cover layer-free layers show no signs of tackiness and in the exposed state are resistant to alkaline developers and acid alcoholic fountain solutions.

The manufacture of light-sensitive materials with the mixture of the invention is carried out in the known manner. For example, the mixture can be dissolved in a solvent and the solution or dispersion is then applied to the respective support as a thin film by die-coating, spraying, dip-coating or roller application, and subsequently dried.

The copying layers are exposed and developed in known manner. Suitable developers are aqueous, preferably aqueous-alkaline solutions, for example, of alkali metal phosphates or alkali metal silicates, which may contain small quantities of miscible organic solvents and surfactants. If desired, it is also possible to use organic solvents or mixtures thereof as developers.

The mixtures according to the invention can be used particularly advantageously in the form of presensitized copying materials on suitable supports, such as, for example, aluminum or zinc, for the photomechanical production of offset printing plates. Further possible applications are the production of dry resist films, relief images, screen printing stencils and color proofing films, or the use as a photoresist solution.

In the text which follows, the preparation of the polymerizable compounds is initially explained. The examples which follow describe individual embodiments of the mixture according to the invention. The quantities of the individual layer components employed are indicated in parts by weight (p.b.w.). Unless otherwise stated, percentage ratios and quantity ratios are to be understood as weight units.

Examples of the preparation of compounds of the general formula I with $R_2$=oxygen atom:

A. Chlorocarboxylation of phenols of the Formula
HO—$R_1$—OH (a) At temperatures below 5° C., 85 g (0.86 mole) of phosgene are added to a solution of 75.3 g (0.25 mole) of 2,2-bis-(4-hydroxy-phenyl)-acetic acid butyl ester in 250 ml of toluene. The mixture is cooled down to −10° C., and 60.5 g (0.5 mole) of dimethyl aniline, which are dissolved in 60 ml of toluene, are added dropwise. After a reaction time of 15 hours at room temperature the excess phosgen is removed by means of a nitrogen stream. The mixture is diluted with 250 ml of toluene, repeatedly washed with water, and the solvent is distilled off in vacuo. 66 g (0.15 mole; 62%) of 2,2-bis-(4-chlorocarbonyloxyphenyl)-acetic acid butyl ester are obtained.

(b) As described under (a), 47.5 g (0.15 mole) of 1,1,1-trichloro-2,2-bis-(4-hydroxyphenyl)ethane, dissolved in 200 ml of toluene, are reacted with 53 g (0.53 mole) of phosgene in the presence of 36.3 g (0.3 mole) of dimethyl aniline. 61 g (0.138 mole; 92%) of 1,1,1-trichloro-2,2-bis-(4-chlorocarbonyloxyphenyl)-ethane are obtained.

B. Reaction of chlorocarbonyloxy aromatic compounds with hydroxyethyl methacrylates (a) 17.7 g (50 mmole) of 2,2-bis-(4-chlorocarbonyloxyphenyl)propane and 0.5 g of hydroquinone are dissolved in 100 ml of toluene. At 20°–25° C., first 28.6 g (220 mmole) of hydroxyethyl methacrylate, and then 12 g (120 mmole) of triethylamine are added dropwise. After 5 hours, further 100 ml of toluene are added and the reaction mixture is washed with water. The organic phase is concentrated, and 20 g (37 mmole; 74%) of 2,2-bis-(4-methacryloyloxy-ethyloxy-carbonyloxyphenyl)propane are obtained (compound 1).

(b) 19.1 g (50 mmole) of 2,2-bis-(4-chlorocarbonyloxyphenyl) acetic acid methyl ester are dissolved in 100 ml of toluene and 0.5 g of hydroquinone are added. 28.6 g (220 mmole) of hydroxyethyl methacrylate are added, then 32 ml of triethylamine are added dropwise while cooling with ice, so that the temperature does not exceed 20° C. After 5 hours, water is added. The organic phase is separated, the aqueous phase is reextracted with toluene, and the united organic phases are repeatedly washed with water. The solvent is distilled off, and 22 g (38.6 mmole; 77%) of 2,2-bis-(4-methacryloyloxy-ethyloxy-carbonyloxyphenyl) acetic acid methyl ester are obtained (compound 5).

(c) 25 g (110 mmole) of 1,3-bis-methacryloyl-glycerol are added at room temperature to a solution of 9.6 g (25 mmole) of 2,2-bis-(4-chlorocarbonyloxyphenyl) acetic acid methyl ester and 0.5 g of hydroquinone in 100 ml of toluene. To this solution 17 ml of triethylamine are added dropwise at a temperature of 10° C. After 15 hours, processing is continued as described under (b). 18 g (23.5 mmole; 94%) of compound 6 are obtained.

(d) 28.6 g (0.25 mole) of hydroxyethyl methacrylate are added at room temperature to a solution of 16.3 g (50 mmole) of 4,4'-bis-chlorocarbonyloxydiphenyl ether and 0.5 g of hydroquinone in 100 ml of toluene. The solution obtained is cooled with ice while 33 ml of triethylamine are being added dropwise. After 15 hours, the mixture is diluted with toluene, well washed with water, and the solvent is distilled off in vacuo. 18 g (35 mmole; 70%) of 4,4'-bis-(methacryloyloxy-ethyloxycarbonyloxy)-diphenyl ether are obtained (compound 8).

(e) 21.5 g (50 mmole) of 1,1-bis-(4-chlorocarbonyloxyphenyl)-1-phenyl-ethane and 0.5 g of hydroquinone monomethyl ether are dissolved in 100 ml of toluene; 28.6 g (220 mmole) of hydroxyethyl methacrylate are added and the mixture is reacted by dropwise adding 32 ml of triethylamine at a temperature of 10° C. The further processing is carried out as described under (b), and 26.4 g (44 mole; 88%) of compound 14 are obtained.

(f) 10.8 g (25 mmole) of 1,1-bis-(4-chlorocarbonyloxyphenyl)-1-phenyl ethane and 12.5 g (55 mmole) of 1,3-bis-methacryloyl glycerol in 100 ml of toluene are reacted in the presence of 0.3 g of hydroquinone by adding 17 ml of triethylamine and processed as described above. 19.5 g (24.4 mmole; 98%) of compound 15 are obtained.

(g) 28.6 g (220 mmole) of hydroxyethyl methacrylate are added to a solution of 19.25 g (50 mmole) of 1,1-bis-(4-chlorocarbonyloxyphenyl)-cyclohexane and 0.5 g of hydroquinone monomethyl ether in 100 ml of toluene. 34 ml of triethylamine are added dropwise while the solution is being cooled with ice. After 20 hours, the double quantity of toluene is added, the mixture is repeatedly washed with water, and the solvent is distilled off in vacuo. 23.2 g (40 mmole; 80%) of 1,1-bis-(4- methacryloylethoxy-carbonyloxyphenyl)-cyclohexane are obtained (compound 17).

(h) 9.6 g (25 mmole) of 1,1-bis-(4-chlorocarbonyloxyphenyl)-cyclohexane and 0.2 g of hydroquinone are dissolved in 100 ml of toluene, and 14 g of 1,3-bis-methacryloyl glycerol are added. Then 17 ml of triethylamine are added dropwise, whereby the temperature increases up to about 45° C. The mixture is allowed to react for 15 hours at room temperature, and then it is processed as described under g). 17 g (22 mmole; 88%) of compound 18 are obtained.

TABLE 1

Examples of compounds of the general formula I with $R_2 = $ oxygen and $R_3 = CH_3$.

| compound No. | $R_1$ | $R_4$ |
|---|---|---|
| 1 | –C₆H₄–C(CH₃)₂–C₆H₄– | H |
| 2 | –C₆H₄–C(CH₃)₂–C₆H₄– | M[1] |
| 3 | –C₆H₄–CH(CO₂C₄H₉)–C₆H₄– | H |
| 4 | –C₆H₄–CH(CO₂C₄H₉)–C₆H₄– | M |
| 5 | –C₆H₄–CH(CO₂CH₃)–C₆H₄– | H |
| 6 | –C₆H₄–CH(CO₂CH₃)–C₆H₄– | M |
| 7 | –C₆H₄–CH(CCl₃)–C₆H₄– | H |
| 8 | –C₆H₄–O–C₆H₄– | H |
| 9 | –C₆H₄–O–C₆H₄– | M |
| 10 | –C₆H₄–SO₂–C₆H₄– | H |
| 11 | –C₆H₄– | H |
| 12 | –C₆H₄–CH₂–C₆H₄– | H |
| 13 | –C₆H₄–CH₂–C₆H₄– | M |
| 14 | –C₆H₄–C(CH₃)(C₆H₅)–C₆H₄– | H |
| 15 | –C₆H₄–C(CH₃)(C₆H₅)–C₆H₄– | M |
| 16 | –C₆H₄–C(CH₃)(CH₂CH₂COOH)–C₆H₄– | H |
| 17 | –C₆H₄–C(cyclohexyl)–C₆H₄– | H |
| 18 | –C₆H₄–C(cyclohexyl)–C₆H₄– | M |
| 19 | –C₆H₄–C(CH₃)(CH₂–COOCH₃)–C₆H₄– | H |

TABLE 1-continued

Examples of compounds of the general formula I with $R_2$ = oxygen and $R_3$ = $CH_3$.

| compound No. | $R_1$ | $R_4$ |
|---|---|---|
| 20 | 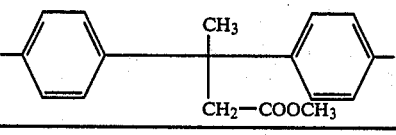 | M |

$^{(1)}$M is the radical $-CH_2-O-\underset{\underset{O}{\|}}{C}-\underset{\underset{CH_3}{|}}{C}=CH_2$ Examples for the preparation of compounds of the general formula II:

A. Preparation of chloroacetyl compounds (a) 81 ml (1.02 moles) of chloroacetyl chloride, dissolved in 200 ml of methylene chloride, are dropwise added to a suspension of 200 g of aluminum chloride in 500 ml of dry methylene chloride. After one hour, 85 g (0.5 mole) of diphenyl ether, which has also been dissolved in 200 ml of methylene chloride, is added dropwise to this mixture. This mixture is refluxed for 10 to 15 hours, poured on ice, acidified with concentrated hydrochloric acid, and extracted with methylene chloride. Following concentration of the organic phase the remaining 4,4'-bis-chloroacetyl-diphenyl ether is twice recrystallized from toluene/hexane. The melting point is 108° C. (lit. 102° C.).

(b) 84 g (0.5 mole) of diphenyl methane are reacted as described under (a), whereby 50 g (31%) of 4,4'-bis-chloroacetyl-diphenyl methane having a melting point of 122°–124° C. are obtained.

(c) 180 g of 2,2'-dibromo-diethyl ether are added dropwise to a mixture of 188 g of phenol, 60 ml of water and 120 g of caustic soda. After 16 hours, the mixture is poured in ice water, filtered by suction, and recrystallized from ethyl acetate. 158 g (80%) of 2,2'-bis-(phenoxy)diethyl ether having a melting point of 60° C. are obtained. 80 g of aluminum chloride are suspended in 200 ml of methylene chloride, and 46 g of chloroacetyl chloride are added dropwise. After one hour, 52 g of bis-(2-phenoxy-ethyl)-ether, dissolved in 80 ml of methylene chloride, are added dropwise, and the mixture is refluxed for 15 hours. Then it is carefully poured on ice, acidified with 200 ml of concentrated hydrochloric acid, extracted with methylene chloride, the organic phase is washed with water, concentrated, and the product obtained is recrystallized from toluene/hexane. 55 g (32%) of 2,2'bis-(4-chloroacetyl-phenoxy)-diethyl ether having a melting point of 134° C. are obtained.

(d) 160 g of 2-bromoethyl-phenyl ether are added to a mixture of 94 g of phenol, 30 ml of water and 60 g of sodium hydroxide, at a temperature of 100° C. After a reaction time of 16 hours, the mixture is poured into water, filtered by suction, and the product is recrystallized from ethyl acetate. 90 g (53%) of 1,2-diphenoxy ethane having a melting point of 95° C. are obtained.

120 g of aluminum chloride are suspended in 300 ml of methylene chloride, and 70 g of chloroacetyl chloride, dissolved in 120 ml of methylene chloride, are added dropwise. After one hour, a solution 64 g of 1,2-diphenoxy-ethane in methylene chloride is added dropwise, and the reaction mixture is refluxed for 15 hours. Then it is poured onto ice and further processed as described under (c). 45 g (41%) of 1,2-bis-(4-chloroacetylphenoxy)-ethane having a melting point of 165° C. are obtained.

B. Reaction of chloroacetyl compounds with (meth) acrylic acid (a) 70 g of 4,4'-bis-chloroacetyl-diphenyl ether, 60 g of methacrylic acid and 0.2 g of hydroquinone are dissolved in 350 ml of acetone, 100 g triethylamine are added, and the mixture is refluxed for 5 hours. The mixture is filtered from the precipitated ammonium salt by suction, concentrated in vacuo, redissolved in methylene chloride, and the organic phase is washed with 2N HCL, 2N NaOH and with water. After concentrating, recrystallization from ethyl acetate is performed, whereby 49 g (50%) of the compound 21 having a melting point of 103°–105° C. are obtained.

(b) 25 g of 4,4'-bis-chloroacetyl-diphenyl sulfide, 19 g of methacrylic acid and 0.2 g of hydroquinone are dissolved in 350 ml of acetone, 38 g of triethylamine are added dropwise, and the mixture is refluxed for 5 hours. Processing is carried out as described under (a). Recrystallization is performed from ethanol, whereby 21 g (66%) of the compound 23 having a melting point of 99° C. are obtained.

(c) 15.4 g of 4,4'-bis-chloroacetyl-biphenyl, 0.2 g of hydroquinone and 11 g of acrylic acid are dissolved in 300 ml of acetone, and 45 g of triethylamine are added dropwise. The reaction mixture is refluxed for 5 hours and processed as described under (a). 13.6 g (72%) of the compound 26 having a melting point of about 190° C. are obtained.

(d) 16 g of 4,4'-bis-chloroacetyl-diphenyl methane and 11 g of acrylic acid are dissolved in 300 ml of acetone and stabilized by means of 0.1 g of hydroquinone. 26 g of triethylamine are added dropwise, the mixture is refluxed for 4 hours, and processed as described under (a). After recrystallization from ethyl acetate 10 g (51%) of the compound 28 having a melting point of 118° C. are obtained.

(e) 20.6 g of 2,2'-bis-(4-chloroacetyl-phenoxy)-diethyl ether and 13 g of methacrylic acid are reacted as described under (c). 14.6 g (57%) of the compound 29 having a melting point of 138° C. are obtained.

(f) The reaction is carried out as described under (e), but instead of methacrylic acid, an equivalent quantity of acrylic acid is employed. 18.5 g (77%) of the compound 30 are obtained.

(g) Under the action of 45 g of triethylamine, 18.4 g of 1,2-bis-(4-chloroacetyl-phenoxy)-ethane are reacted with 13 g of methacrylic acid in 300 ml of acetone. After recrystallization from ethyl acetate, the reaction product yields 7.2 g (36%) of the compound 31 having a melting point of 142°–146° C.

(h) 6 g of 1,3-bis-(4-chloroacetyl-phenoxy)-propane and 0.1 g of hydroquinone are dissolved in 200 ml of acetone. After addition of 4.1 g of methacrylic acid, 14.2 g of triethylamine are added dropwise, and the reaction mixture is refluxed for 6 hours. Then it is concentrated, redissolved in methylene chloride, and washed with 2N acetic acid, 2N sodium hydroxide solution and water. After distilling off the water, the product is redissolved in ethyl acetate and the insoluble residue is filtered off. 3.6 g (48%) of compound 33 are obtained.

TABLE II

Examples of compounds of the general formula II:

| compound No. | R₁ | R₃ |
|---|---|---|
| 21 | -C₆H₄-O-C₆H₄- | CH₃ |
| 22 | -C₆H₄-O-C₆H₄- | H |
| 23 | -C₆H₄-S-C₆H₄- | CH₃ |
| 24 | -C₆H₄-S-C₆H₄- | H |
| 25 | -C₆H₄-C₆H₄- | CH₃ |
| 26 | -C₆H₄-C₆H₄- | H |
| 27 | -C₆H₄-CH₂-C₆H₄- | CH₃ |
| 28 | -C₆H₄-CH₂-C₆H₄- | H |
| 29 | -C₆H₄-O-CH₂CH₂-O-CH₂CH₂-C₆H₄- | CH₃ |
| 30 | -C₆H₄-O-CH₂CH₂-O-CH₂CH₂-C₆H₄- | H |
| 31 | -C₆H₄-O-CH₂CH₂-O-C₆H₄- | CH₃ |
| 32 | -C₆H₄-O-CH₂CH₂-O-C₆H₄- | H |
| 33 | -C₆H₄-O-CH₂CH₂-O-C₆H₄- | CH₃ |

Examples of the preparation of compounds of the general formula I, with R₂=CH₂CH₂CO and R₃=H:

(a) 22 g of bis-(4-(3-carboxy-proprionyl)phenyl)ether and 0.3 g of hydroquinone are dissolved in 350 ml of toluene. 2 ml of concentrated sulphuric acid are added. The reaction mixture is refluxed at the water separator, and 23.5 g of hydroxyethyl methacrylate are slowly added dropwise. When about 3 ml of an aqueous phase have been separated off, the toluene phase is washed with 2N NaOH and concentrated, whereby 32 g (90%) of the compound 34 are obtained.

(b) 18.5 g of bis-(4(3-carboxy-proprionyl)phenyl)ether, 0.2 g of hydroquinone and 1.5 ml of concentrated sulphuric acid are refluxed in 350 ml of toluene. When 34 g of 1,3-bis-(methacryloyl)glycerol are added, 2.5 ml of water are separated off. Filtering off from the polymeric residue which has formed is carried out, the organic phase is washed out with water and concentrated. 31 g (81%) of the compound 35 are obtained.

(c) 38.6 g of bis-(4-(3-carboxy-proprionyl)phenyl)sulfide, 3 ml of concentrated sulphuric acid, 0.4 g of hydroquinone and 0.4 g of cuprous oxide are refluxed in 350 ml of toluene, and 27 g of hydroxyethyl methacrylate are added dropwise. After 4 ml of an aqueous phase have been separated off, the product is washed with 2N sodium hydroxide solution and concentrated. 56 g (92%) of the compound 36 are obtained.

(d) 18.4 g of bis-(4-(3-carboxy-proprionyl)phenyl)methane are refluxed with 1.5 ml of concentrated sulphuric acid, 0.2 g of hydroquinone and 19.4 g of hydroxyethyl methacrylate are refluxed in 300 ml of toluene, until 2.3 ml of water have been separated off. The mixture is then washed with 2N NaOH and water and concentrated in vacuo. 20 g (55%) of the compound 37 are obtained.

(e) 17.7 g of 4,4'-bis-(3-carboxyproprionyl)biphenyl are reacted as described under (d). 26.5 g (92%) of the compound 38 are obtained.

| compound No. | R₁ | R₄ |
|---|---|---|
| 34 | -C₆H₄-O-C₆H₄- | H |
| 35 | -C₆H₄-O-C₆H₄- | M⁽¹⁾ |
| 36 | -C₆H₄-S-C₆H₄- | H |

-continued

| compound No. | $R_1$ | $R_4$ |
|---|---|---|
| 37 | 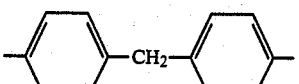 | H |
| 38 | 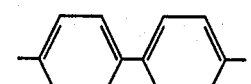 | H |

$$^{(1)}M = -CH_2-O-\underset{\underset{O}{\|}}{C}-\underset{\underset{CH_3}{|}}{C}=CH_2$$

EXAMPLE 1

Electrochemically roughened and anodized aluminum, having an oxide layer of 3 g/m², which had been pretreated with an aqueous solution of polyvinylphosphonic acid, was used as the support for printing plates.

This support was spin-coated with a solution of the following composition:
- 2 p.b.w. of a copolymer of styrene and maleic acid anhydride having a mean molecular weight of 20,000 and an acid number of 180-200 (Scripset 540, produced by Monsanto)
- 2 p.b.w. of compound 4
- 0.125 p.b.w. of 9-phenyl-acridine, and
- 0.06 p.b.w. of the azo dyestuff obtained from 2,4-dinitro-6-chloro-benzenediazonium salt and 2-methoxy-5-acetylamino-N-cyanoethyl-N-hydroxyethyl-aniline, in
- 26 p.b.w. of butanone, and
- 14 p.b.w. of butyl acetate.

The application was effected in such a way that a dry layer weight of 3.7-4 g/m² was obtained. Then, the plate was dried for 2 minutes at 100° C. in a circulating air drying cabinet.

The printing plate obtained was exposed for 40 seconds, using a 5 kW metal halide lamp and at a distance of 110 cm between lamp and vacuum copying frame, under a 13-step exposure wedge with density increments of 0.15.

Subsequently, the plate was developed manually with a developer of the following composition:
- 3.0 p.b.w. of sodium metasilicate×9H₂O,
- 0.03 p.b.w. of a non-ionic surfactant (coconut fatty alcohol polyoxyethylene ether with about 8 oxyethylene units),
- 0.003 p.b.w. of an anti-foam agent, and
- 96.967 p.b.w. of deionized water.

5 completely cross-linked wedge steps were obtained.

EXAMPLE 2

0.04 g of amorphous, highly porous silica acid havig a mean particle size of 8 μm (Syloid Al 1) was added to the coating solution of Example 1. The dispersion obtained was spin-coated onto a layer support, in a way such that a layer weight of 3.5 g/m² was obtained.

The plate was processed as described in Example 1.

5 completely cross-linked wedge steps were obtained.

In a conventional damping unit, 180,000 prints were obtained from this printing plate; in an alcohol damping unit 90,000 prints were obtained.

EXAMPLE 3

After drying, the coated plate of Example 2 was coated with a 15% strength aqueous solution of polyvinyl alcohol (12% residual acetyl groups, K-value 4). A cover layer having a dry weight of 5 g/m² was obtained.

Portions of the plate were exposed for 5, 10, 20 and 40 seconds, using a metal halide lamp, under a 13-step exposure wedge having density increments of 0.15; developing was then performed with the developer solution described under Example 1.

In another test, the plate was heated after exposure at 100° C. in a circulating air drying cabinet for 5 seconds, and subsequently developed.

The following table shows that the layer works strictly reciprocally and that the post-heating step results in a clear increase of the number of completely cross-linked steps:

| Exposure time (seconds) | 5 | 10 | 20 | 40 |
|---|---|---|---|---|
| Wedge steps without post-heating | 3 | 5 | 7 | 9 |
| Wedge steps with post-heating | 8 | 9 | 11 | 13 |

If layers are prepared using other monomers (for example, trimethylol-ethane triacrylate), the number of cross-linked steps under the influence of oxygen (i.e., when no cover layer is applied) is much lower than in cases where a cover layer has been applied (3 wedge steps without a cover layer, 9 wedge steps with a cover layer, at an exposure time of 40 seconds).

EXAMPLE 4

A coating solution was prepared from
- 1 p.b.w. of a methyl methacrylate/methacrylic acid copolymer having a molecular weight of 30,000 and an acid number of 117,
- 1 p.b.w. of the styrene/maleic acid anhydride copolymer of Example 1,
- 2 p.b.w. of compound 3,
- 0.125 p.b.w. of 9-phenyl-acridine,
- 0.07 p.b.w. of the blue dyestuff of Example 1,
- 0.04 p.b.w. of the silicic acid of Example 2, in
- 21 p.b.w. of butanone and
- 11 p.b.w. of butyl acetate.

This solution was spin-coated onto the aluminum support described in Example 1, in a way such that a layer weight of 5 g/m² was obtained.

Exposure, developing and evaluation were carried out as described in Example 1.

4 completely cross-linked wedge steps were obtained.

EXAMPLE 5

The layer support described in Example 1 was spin-coated with the following solutions, in such a way that a layer weight of 3.5 g/m² resulted:
- 2 p.b.w. of the copolymer of Example 1,
- 1.8 p.b.w. of one of the compounds listed in Table IV below,
- 0.5 p.b.w. of 9-phenyl-acridine, and
- 0.05 p.b.w. of the azo dyestuff of Example 1, in
- 23 p.b.w. of butanone,
- 12 p.b.w. of butyl acetate, and
- 12 p.b.w. ethylene glycol monomethyl ether.

The plates were exposed for 40 seconds and developed with the developer solution of Example 1.

The following numbers of completely cross-linked wedge steps were obtained:

TABLE IV

| Compound No. | Wedge Steps | Compound No. | Wedge Steps |
|---|---|---|---|
| 1 | 2 | 20 | 4 |
| 2 | 1–2 | 21 | 4 |
| 3 | 3–4 | 22 | 4 |
| 4 | 4 | 23 | 1–2 |
| 5 | 5 | 24 | 2 |
| 6 | 3 | 25 | 2 |
| 7 | 2 | 26 | 1–2 |
| 8 | 4 | 27 | 3 |
| 9 | 4 | 28 | 2–3 |
| 10 | 3 | 29 | 2 |
| 11 | 3 | 30 | 1–2 |
| 12 | 4 | 31 | 2 |
| 13 | 2–3 | 32 | 3 |
| 14 | 3 | 33 | 2–3 |
| 15 | 2–3 | 34 | 4 |
| 16 | 3 | 35 | 3–4 |
| 17 | 2 | 36 | 2 |
| 18 | 3 | 37 | 3 |
| 19 | 5 | 38 | 2–3 |

EXAMPLE 6

A solution of
6.5 p.b.w. of a terpolymer of n-hexylmethacrylate, methacrylic acid and styrene (60:30:10 p.b.w.), having a mean molecular weight of about 35,000,
5.6 p.b.w. of the monomer of Example 1,
0.2 p.b.w. of 9-phenyl-acridine, and
0.03 p.b.w. of the blue azo dyestuff of Example 1, in 25 p.b.w. of butanone,
2 p.b.w. of ethanol, and
1 p.b.w. of butyl acetate
was spin-coated onto a biaxially stretched and thermoset 25 μm thick polyethylene terephthalate film, in such a way that after drying at 100° C. a layer weight of 35 g/m² was obtained.

By means of a conventional laminating apparatus, the dry resist film thus prepared was laminated at 120° C. onto a phenoplast laminate sheet, to which a 35 μm copper foil had been bonded, and exposed for 20 seconds with a conventional exposure apparatus. A line original having line widths and spacings of down to 80 μm was used as the original.

After exposure, the polyester film was removed and the layer was developed for 90 seconds with the developer solution of Example 1 in a spray developing device.

The plate was then rinsed for 30 seconds with tap water, etched for 30 seconds in a 15% strength ammoniumperoxydisulfate solution, and then electroplated successively in the following electroplating baths:

(1) 30 minutes in a "Glanzkupfer-Bad" type copper electrolye bath made by Schloetter, Geislingen/Steige; current density: 2.5 A/dm²; metal buildup: 14 μm.

(2) 10 minutes in a "Norma" type nickel bath made by Schloetter, Geislingen/Steige; current density: 4 A/dm²; metal buildup: 9 μm.

The plate showed no undercutting or damage.

It was then possible to decoat the plate in a 5% KOH solution at 50° C., and the exposed copper could be removed by etching in the customary etching media.

EXAMPLE 7

The photoresist solution of Example 6 was spin-coated in the manner described, onto a phenoplast laminate sheet, to which a 35 μm thick copper film had been bonded, and dried (layer weight 30 g/m²).

As described in Example 6, the plate was exposed, developed and electroplated, whereby the following bath was used instead of the nickel bath:

15 minutes in a lead-tin bath "LA" made by Schloetter, Geislingen/Steige; current density: 1 A/dm²; metal buildup: 15 μm.

This plate, too, did not show any signs of undercuttings or damage. It could be decoated with a KOH solution and etched with customary etching agents.

TABLE V

| Compound No. | Wedge Steps |
|---|---|
| 4 | 4 |
| 5 | 5 |
| 19 | 5 |
| 21 | 4 |

EXAMPLE 8

The layer support described in Example 1 was spin-coated with the following solution, in a way such that a layer weight of 3.5 g/m² was obtained.
2.6 p.b.w. of compound 19,
6.5 p.b.w. of a styrene/maleic acid ester copolymer having an acid number of 145–160 and a softening point of 140°–160° C.,
70 p.b.w. of ethylene glycol monomethyl ether,
0.1 p.b.w. of 9-phenyl-acridine
0.035 p.b.w. of the azo dyestuff described in Example 1, and
1.0 p.b.w. of the reaction product of 1 mole of 2,2,4-trimethyl-hexamethylene diisocyanate and 2 moles of 2-hydroxyethylmethacrylate.

Thereafter, the coated plate was dried for 2 minutes at 100° C. in a circulating air drying cabinet and provided with a cover layer as described in Example 3. By means of a ®Laserite apparatus made by Eocom Corp., which was equipped with an argon ion laser, the plate was then irradiated with 200 mW and 1,200 lines/inch (5.3 mJ/cm²). The image contrast after irradiation was good. Subsequently, the plate was developed with the developer described in Example 1. When the exposure was immediately followed by developing, the number of completely cross-linked wedge steps on a continuous tone step wedge was 3.

When the plate was identically processed, with the only difference being that the plate was heated to 80° C. for 7 seconds between exposure and developing, 5 wedge steps were obtained.

Proof-printing and printing were performed on an offset printing machine of the type GTO, made by Heidelberger Druckmaschinen and possessing a Dahlgren damping device. The number of prints achieved was 100,000 without intermediate heating, and 150,000 with intermediate heating.

What is claimed is:

1. A mixture is polymerizable by radiation, comprising:
   (a) a polymerizable compound having terminal acrylic or methacrylic acid ester groups, selected from a compound of one of the general formulas

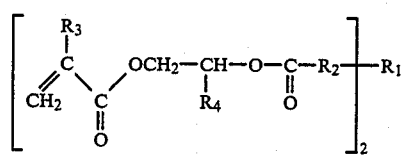 (I)

and

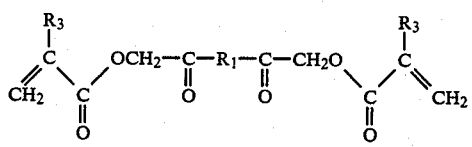 (II)

wherein
R₁ is a phenylene group or a biphenyldiyl group or a group formed by two phenylene groups which are linked by a bridge comprising an oxygen atom, a sulphur atom, a sulfone group, a substituted or unsubstituted alkylene group or cycloalkylene group, or a group of the formula —(O—alkylene)-$_n$O— with n=1–3,
R₂ is an oxygen atom or the group $CH_2$—$CH_2$—CO;
R₃ is a hydrogen atom or a methyl radical; and
R₄ is a hydrogen atom or the radical

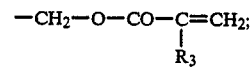

(b) an aqueous soluble organic polymeric binder; and
(c) a polymerization initiator which can be activated by radiation.

2. A mixture as claimed in claim 1, wherein R₃ is a methyl radical.

3. A mixture as claimed in claim 1, wherein R₁ is a diphenyl ether group.

4. A mixture as claimed in claim 1, wherein R₁ is a diphenyl alkanoic ester group.

5. A mixture as claimed in claim 1, wherein said polymeric binder is soluble or at least swellable in an aqueous alkaline solution.

6. A photopolymerizable copy material, comprising:
a support; and
a layer of a photopolymerizable mixture as defined according to claim 1 placed on said support.

7. A photopolymerizable copy material as claimed in claim 6, wherein said photopolymerizable mixture layer is in exposure to the atmosphere.

* * * * *